(12) United States Patent
Pan

(10) Patent No.: US 11,294,361 B2
(45) Date of Patent: Apr. 5, 2022

(54) INSPECTION METHOD FOR INSPECTING DISPLAY PANEL AND INSPECTION APPARATUS

(71) Applicants: HKC Corporation Limited, Shenzhen (CN); Chongqing HKC Optoelectronics Technology Co., ltd., Chongqing (CN)

(72) Inventor: Po-Sung Pan, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 465 days.

(21) Appl. No.: 16/341,789

(22) PCT Filed: Oct. 23, 2017

(86) PCT No.: PCT/CN2017/107211
§ 371 (c)(1),
(2) Date: Apr. 12, 2019

(87) PCT Pub. No.: WO2018/153120
PCT Pub. Date: Aug. 30, 2018

(65) Prior Publication Data
US 2021/0333784 A1    Oct. 28, 2021

(30) Foreign Application Priority Data

Feb. 23, 2017  (CN) .......................... 201710100531.1

(51) Int. Cl.
*G05B 19/418*    (2006.01)
*H01L 21/67*     (2006.01)

(52) U.S. Cl.
CPC .. *G05B 19/41875* (2013.01); *H01L 21/67276* (2013.01); *G05B 2219/32368* (2013.01)

(58) Field of Classification Search
CPC .......... G05B 19/41875; G05B 23/0221; G05B 2219/32368; H01L 21/67276
See application file for complete search history.

(56) References Cited

U.S. PATENT DOCUMENTS 6,509,201 B1 * 1/2003 Wright .................... H01L 22/20
                                                    257/E21.525
2006/0287751 A1 * 12/2006 Dishner ............. G05B 23/0221
                                                    700/110

(Continued)

FOREIGN PATENT DOCUMENTS

CN              104134620 A   * 11/2014

*Primary Examiner* — Kidest Bahta
(74) *Attorney, Agent, or Firm* — WPAT, PC

(57) ABSTRACT

The present application provides a method for inspecting a display panel and an inspection apparatus. Wherein the method for inspecting the display panel including the following steps: setting substrate random sampling parameters in a manufacturing process by a manufacturing execution module, and transmitting the random sampling parameters to a production line control module; receiving and storing the random sampling parameters by the production line control module; generating a random sampling control signal and transmitting to a detector according to the random sampling parameters by the production line control module; and performing a random sampling to a substrate by the detector in accordance with the random sampling control signal.

7 Claims, 4 Drawing Sheets

(56) References Cited

U.S. PATENT DOCUMENTS

2012/0203369 A1\* 8/2012 Behm .............. G05B 19/41875
                                                    700/108
2013/0035876 A1\* 2/2013 Huang ................ G01N 21/956
                                                    702/40

\* cited by examiner

INSPECTION METHOD FOR INSPECTING DISPLAY PANEL AND INSPECTION APPARATUS

FIELD OF THE DISCLOSURE

The disclosure relates to a control technical field, and more particularly to an inspection method for inspecting a display panel and an inspection apparatus.

BACKGROUND

Substrate as an important part of a display panel such as a liquid crystal panel, an organic light emitting diode, OLED display, a quantum dot light emitting diode, QLED display, its quality is essentially important for the displaying performance of the display panel. Strictly quality controls for all stages of the substrates in the coating process are needing to be performed, according to the different products on the production line, the corresponding sampling rate for inspection is needing to be set. However, the existing inspection methods are mostly performing random sampling for the finished products at the end of the production line, and cannot perform accurate sampling inspection for the semi-finished products in every step of the process, affecting the product quality and the inspection efficiency.

SUMMARY

The present application provides a method for inspecting a display panel executed by a computer apparatus; it can perform accurate random sampling for every step of the process by setting a centralized setting of a manufacturing execution module, to improve the yield and inspection efficiency of the substrate.

In order to achieve the above object, the method for inspecting the display panel proposed in the present application includes the steps of:

A method for inspecting a display panel, including:

Setting substrate random sampling parameters in a manufacturing process by a manufacturing execution module, and transmitting the random sampling parameters to a production line control module;

Receiving and storing the random sampling parameters by the production line control module;

Generating a random sampling control signal and transmitting to a detector according to the random sampling parameters by the production line control module; and Performing a random sampling to a substrate by the detector in accordance with the random sampling control signal.

Alternatively, after the step of receiving and storing the random sampling parameters by the production line control module, further including the step of:

Acquiring a product information of the substrate inspected by the detector by the production line control module.

Alternatively, the step of generating the random sampling control signal and transmitting to the detector according to the random sampling parameters by the production line control module, specifically includes:

Comparing the product information with the stored random sampling parameters by the production line control module, and generating the random sampling control signal corresponding to the substrate.

Alternatively, the manufacturing execution module remotely transmits the random sampling parameters to the production line control module by a wireless transmission way.

Alternatively, the production line control module transmits the random sampling control signal to the detector through a control module.

Alternatively, the control module is a programmable logic controller.

Alternatively, the display panel is a liquid crystal display panel, an organic light emitting diode display panel, a quantum dot light emitting diodes display panel or a curved surface display panels.

The present application further provides an inspection apparatus for a display panel, including:

A manufacturing execution module for setting substrate random sampling parameters in a manufacturing process, and transmitting the random sampling parameters to a production line control module;

The production line control module for receiving and storing the random sampling parameters, generating a random sampling control signal and transmitting to a detector; and The detector for performing a random sampling to a substrate in accordance with the random sampling control signal.

Alternatively, the production line control module further includes:

An information acquisition module for acquiring product information of the substrate detected by the detector by the production line control module.

Alternatively, the production line control module further includes:

An analysis comparison module for comparing the product information with the stored random sampling parameters and generating the random sampling control signal corresponding to the substrate.

Alternatively, the manufacturing execution module further includes:

A wireless transmission module for remotely transmitting the random sampling parameters to the production line control module.

Alternatively, the production line control module further includes:

A control module for transmitting the random sampling control signal to the detector.

Alternatively, the control module is a programmable logic controller.

Alternatively, the display panel is a liquid crystal display panel, an organic light emitting diode display panel, a quantum dot light emitting diodes display panel or a curved surface display panels.

The present application further provides an inspection apparatus for performing random sampling to a substrate of a display panel, including:

A manufacturing execution module for setting substrate random sampling parameters in a manufacturing process, and transmitting the random sampling parameters to a production line control module;

The production line control module for receiving and storing the random sampling parameters, generating a random sampling control signal and transmitting to a detector; and The detector for performing a random sampling to a substrate in accordance with the random sampling control signal.

Alternatively, the production line control module further includes:

An information acquisition module for acquiring product information of the substrate detected by the detector by the production line control module.

Alternatively, wherein the production line control module further includes:

An analysis comparison module for comparing the product information with the stored random sampling parameters and generating the random sampling control signal corresponding to the substrate.

Alternatively, the manufacturing execution module further includes:

A wireless transmission module for remotely transmitting the random sampling parameters to the production line control module.

Alternatively, the production line control module further includes:

A control module for transmitting the random sampling control signal to the detector.

Alternatively, the control module is a programmable logic controller.

Alternatively, the display panel is a liquid crystal display panel, an organic light emitting diode display panel, a quantum dot light emitting diodes display panel or a curved surface display panels.

In the technical proposal of the present application, the method for inspecting the display panel includes the steps of: the method for inspecting the display panel proposed in the present application includes the steps of: setting substrate random sampling parameters in a manufacturing process by a manufacturing execution module, and transmitting the random sampling parameters to a production line control module; receiving and storing the random sampling parameters by the production line control module; generating a random sampling control signal and transmitting to a detector according to the random sampling parameters by the production line control module so that the detector performs a random sampling operation according to the random sampling control signal. Each production chains of the manufacturing process are accurately random sampled by the centralized setting of the manufacturing execution module, to improve the yield and the inspection efficiency of the substrate.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the FIG.s.

DETAILED DESCRIPTION OF PREFERRED EMBODIMENTS

Figure 1:
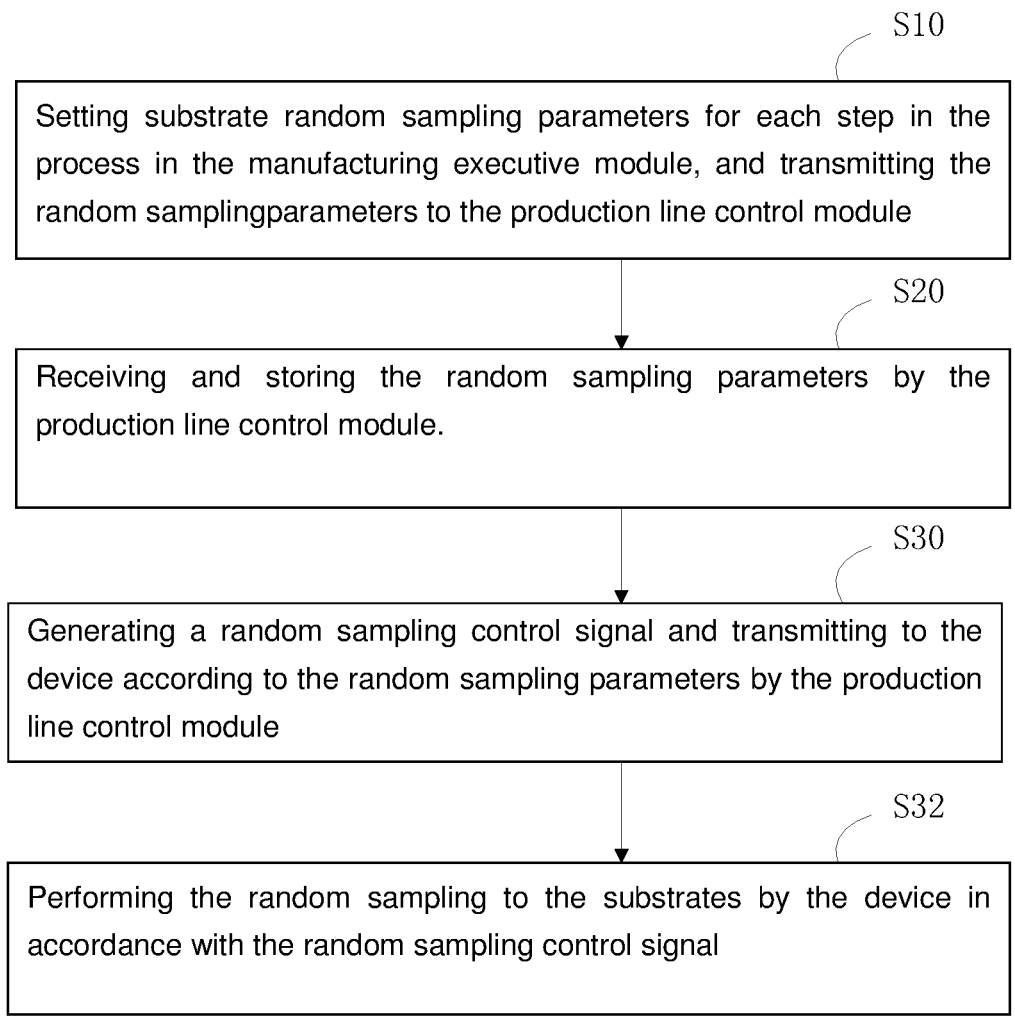
FIG. 1 is a schematic flow diagram of an embodiment of a method for inspecting a display panel of the present application.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "include" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "include" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

In addition, the technical solutions between the various embodiments of the present application may be combined with each other, but must be based on the ability of one of ordinary skill in the art to be realized, and when the combination of technical solutions is contradictory or unachievable, it should be considered that this combination of technical solutions Does not exist, nor is it within the scope of protection required by this application.

The present application provides a method for inspecting a display panel. Referring to FIG. 1, in an embodiment of the present application, the method may be specifically an in-line method for inspecting the display panel, including the steps of:

S10, setting substrate random sampling parameters for each step in the process in the manufacturing execution module, and transmitting the random sampling parameters to the production line control module;

Wherein, the display panel may be, for example, a liquid crystal display panel, LCD, an organic light emitting Diode, OLED display panel, a quantum dot light emitting diodes, QLED display panel, a curved surface display panels or other display panels, etc., and are not specifically limited thereto.

Specifically, step S10 sets the substrate random sampling parameters for each step in the process in the manufacturing execution module, and transmitting the random sampling parameters to the production line control module. The random sampling parameters are decided basing on the production chain of the substrate, mainly including the random sampling rate. During the array process of the substrate, it roughly passes through cleaning, film growth, photo, etching, stripping and other steps, in the process, first the washed substrate should be putting into the sputtering device to coat with a layer of indium tin oxide, ITO semiconductor transparent conductive film, and then forming regional patterns by photo and etching, then the substrate is photoresist stripped and cleaned to complete the production process. In each step, the film quality of the substrate in the production line needs sampling inspection, in order to ensure the follow-up and even finished product yield. In the present embodiment, the user can set the random sampling parameters (the random sampling rate) of the substrate in advance in the manipulation interface of the manufacturing execution module, so as to facilitate unified management and centralized control.

S20, receiving and storing the random sampling parameters by the production line control module. In this step, the production line control module can store the random sampling parameters set in advance to facilitate the subsequent control of the detector.

S30, generating a random sampling control signal and transmitting to the detector according to the random sampling parameters by the production line control module;

S32, performing the random sampling to the substrates by the detector in accordance with the random sampling control signal.

Specifically, the control module of the production line generates the corresponding control signals in different process steps according to the set random sampling parameters, to perform random sampling to the selected substrate by driving the detector. After receiving the random sampling control signal, the detector performs the operation of random sampling, the detector receives the control signal, corresponding to the different process, performs the operation of random sampling according to the corresponding random sampling rate.

In the present embodiment, each production chains of the manufacturing process are accurately random sampled by the centralized setting of the manufacturing execution module, to improve the yield and the inspection efficiency of the substrate.

Figure 2:
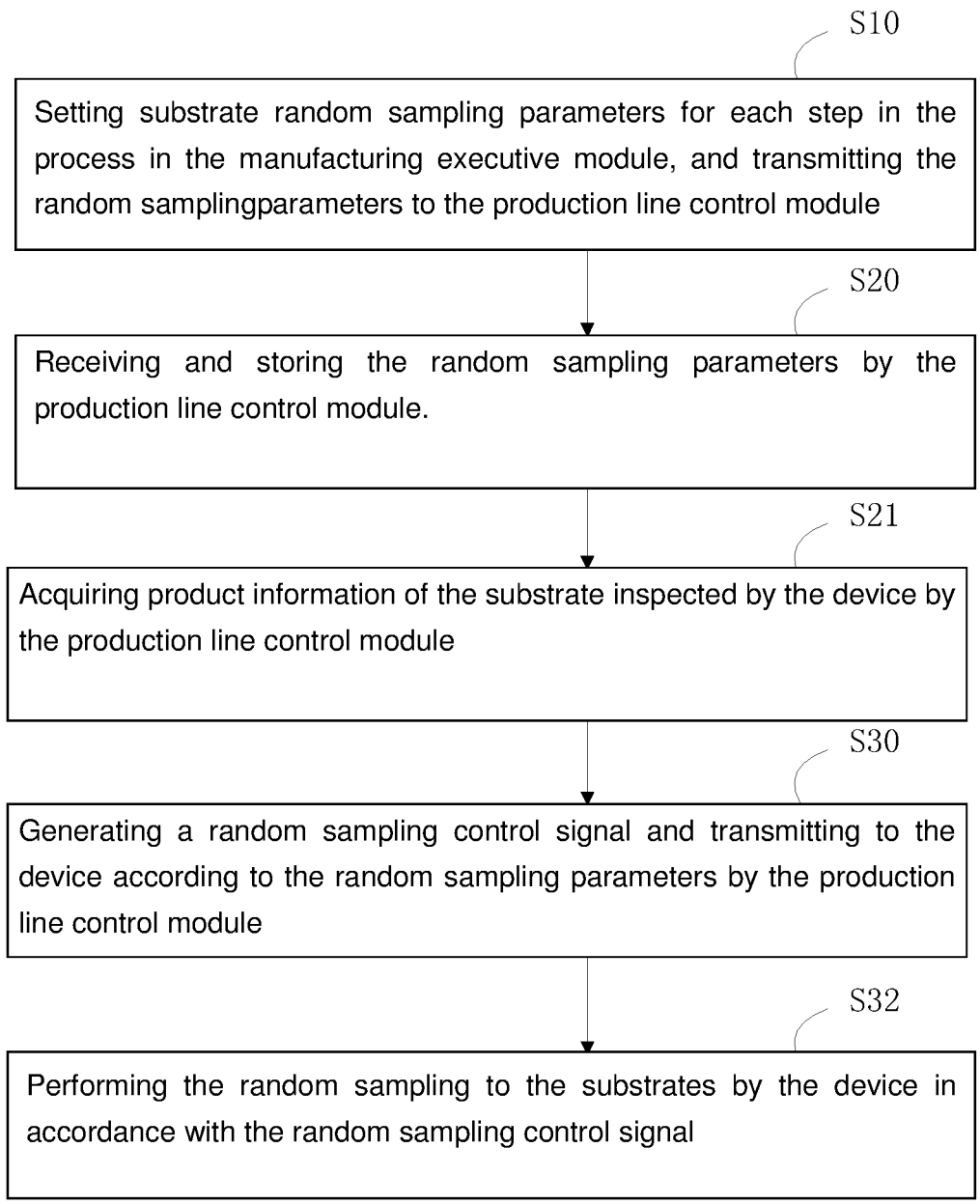
FIG. 2 is a schematic flow diagram of another embodiment of the method for inspecting the display panel of the present application.

Referring to FIG. 2, another embodiment of the inspection method of the display panel of the present application is proposed based on the embodiment of the inspection method of the display panel of the present application. In the present embodiment, after the step S20 further including:

S21, acquiring product information of the substrate inspected by the detector by the production line control module.

As an alternative embodiment, after the step S20 further including S21 acquiring product information of the substrate inspected by the detector by the production line control module. The detector can monitor the product information of the substrate in real time, that is, what kind of process the substrate has passed, what kind of process is needed in the next step, the product information is transmitting to the production line control module.

Figure 3:
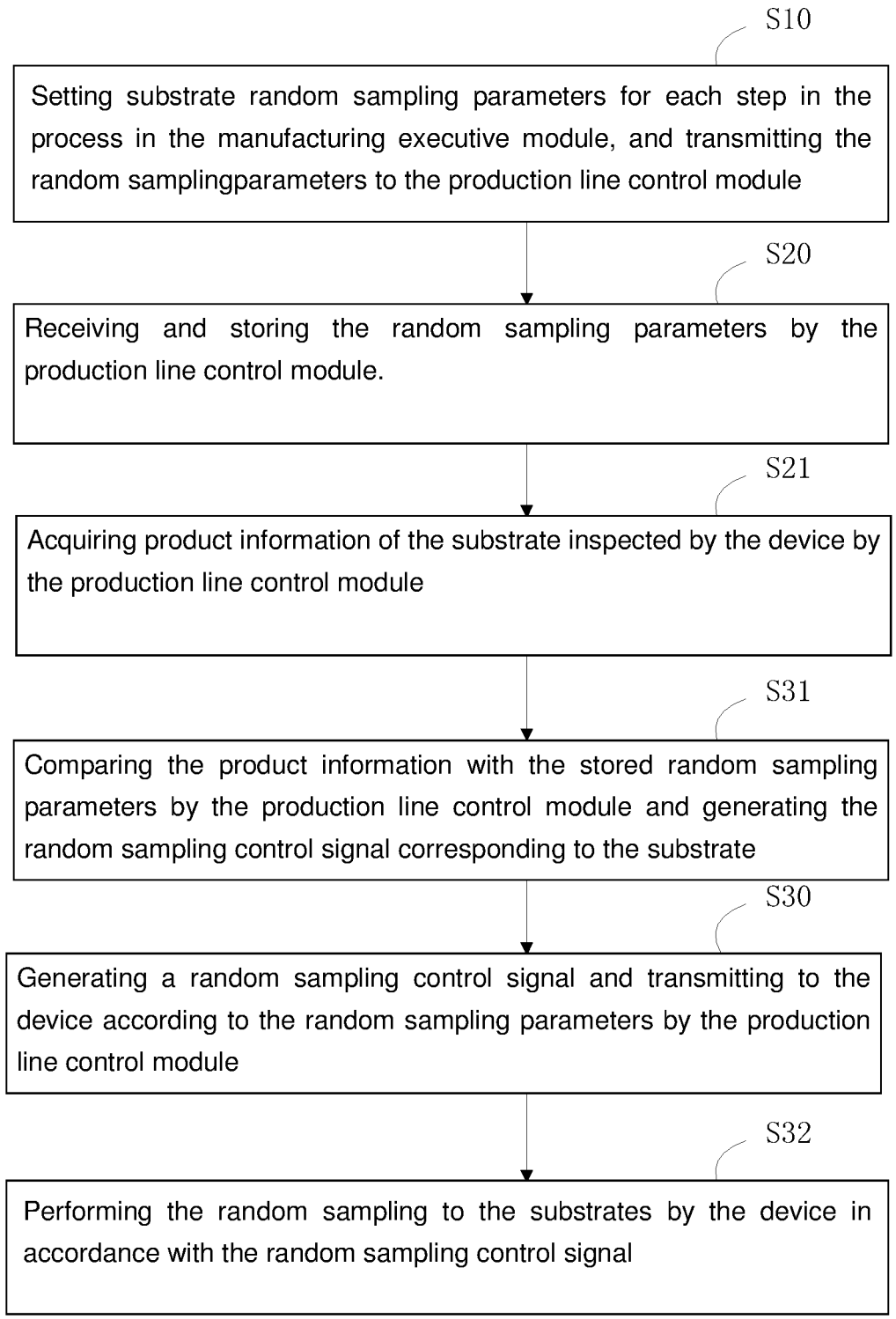
FIG. 3 is a schematic flow diagram of a further embodiment of the method for inspecting the display panel of the present application.

Referring to FIG. 3, another embodiment of the inspection method of the display panel of the present application is proposed based on the embodiment of the inspection method of the display panel of the present application. In the present embodiment, the step S30 specifically includes:

S31, comparing the product information with the stored random sampling parameters by the production line control module and generating the random sampling control signal corresponding to the substrate.

As an alternative embodiment, the step S30 includes: comparing the product information with the stored random sampling parameters by the production line control module and generating the random sampling control signal corresponding to the substrate. When the detector detects the loading of the substrate, the product information of the substrate is transmitted to the production line control module, for comparing with the stored random sampling parameters by the production line control module, and generating the control signal by selecting the corresponding random sampling parameters to drive the detector to perform the random sampling operation.

Alternatively, the manufacturing execution module remotely transmits the random sampling parameters to the production line control module by wireless transmission.

As an alternative embodiment, the manufacturing execution module remotely transmits the random sampling parameters to the production line control module by wireless transmission, since the array process of the substrate needs to be carried out in the ultra-clean plant, there is a high demand for cleanliness of the environment, and therefore, the operation of the operators is greatly restricted. In the present embodiment, the operator can set the random sampling parameters in the manufacturing execution module and transmit it to the production line control module by wireless transmission, and do not have to enter the production line in the ultra-clean plant, greatly improving the work efficiency.

Alternatively, the production line control module transmits the random sampling control signal to the detector through a control module.

As an alternative embodiment, the production line control module transmits the random sampling control signal to the detector through a control module. The present embodiment can adopt the programmable logic controller, PLC controller which is widely used in industry, to realize the control of the production line control module to the detector, and is cost-effective and reliable.

Figure 4:
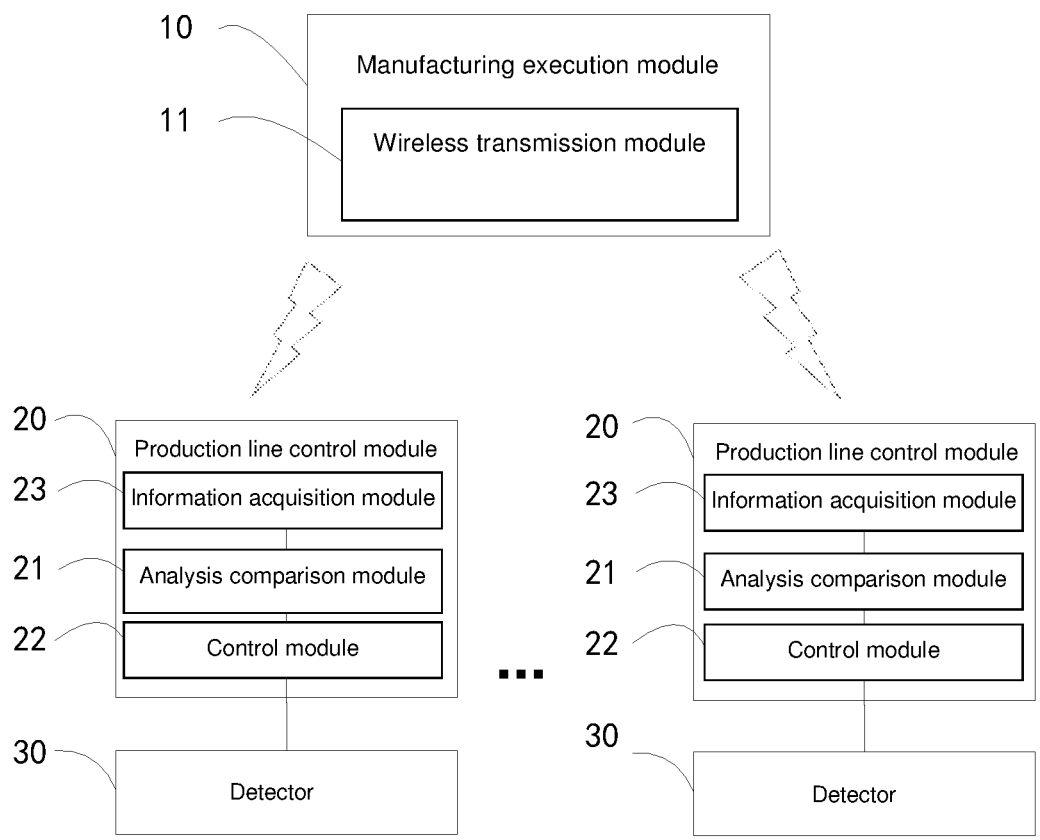
FIG. 4 is a schematic diagram of a functional module of the quality inspection apparatus of the display panel of the present application.

The present application also provides a inspection apparatus for a display panel, referring to FIG. 4, the apparatus includes:

A manufacturing execution module 10 is for setting the substrate random sampling parameters for each step in the process, and transmitting the random sampling parameters to the production line control module 20;

The production line control module 20 is for receiving and storing the random sampling parameters, and generating the random sampling control signal and transmitting to the detector 30;

The detector 30 is for performing the random sampling to the substrates in accordance with the random sampling control signal.

In the present application, the manufacturing execution module 10 is for setting the substrate random sampling parameters for each step in the process, and transmitting the random sampling parameters to the production line control module 20. The random sampling parameters are decided basing on the production chain of the substrate, mainly including the random sampling rate. During the array process of the substrate, it roughly passes through cleaning, film growth, photo, etching, stripping and other steps. In each step, the film quality of the substrate in the production line needs sampling inspection, in order to ensure the follow-up and even finished product yield. In the present embodiment, the user can set the random sampling parameters (the random sampling rate) of the substrate in advance in the manipulation interface of the manufacturing execution module, so as to facilitate unified management and centralized control.

The production line controlling is used to store the random sampling parameters set in advance and generate the random sampling control signal and transmit to the detector 30 according to the random sampling parameters, the production line control module 20 generates the corresponding control signals in different process steps according to the set random sampling parameters, to perform random sampling to the selected substrate by driving the detector 30.

The detector 30 is used for performing the operation of random sampling after receiving the control signal; the detector 30 is used for receiving the control signal, corresponding to the different process, to perform the operation of random sampling according to the corresponding random sampling rate.

In the present embodiment, each production chain of the manufacturing process is accurately random sampled by the centralized setting of the manufacturing execution module 10, to improve the yield and the inspection efficiency of the substrate.

Alternatively, the production line control module 20 further includes:

An information acquisition module 23 for acquiring the product information of the substrate detected by the detector 30 by the production line control module 20.

As an alternative embodiment, the production line control module 20 further includes an information acquisition module 23 for acquiring that after the detector 30 inspecting the loading of the substrate, the product information of the substrate is transmitted to the production line control module 20. The detector 30 can monitor the product information of the substrate in real time, that is, what kind of process the substrate has passed, what kind of process is needed in the next step, the product information is transmitting to the production line control module 20.

Alternatively, the production line control module 20 further includes:

An analysis comparison module 21 for comparing the product information with the stored random sampling parameters, to generate the random sampling control signal corresponding to the substrate.

As an alternative embodiment, the production line control module 20 further includes the analysis comparison module 21 for comparing the product information with the stored random sampling parameters, to generate the random sampling control signal corresponding to the substrate. When the detector 30 detects the loading of the substrate, the product information of the substrate is transmitted to the production line control module 20, for comparing with the stored random sampling parameters by the production line control module 20, and generating the control signal by selecting the corresponding random sampling parameters to drive the detector 30 to perform the random sampling operation.

Alternatively, the manufacturing execution module 10 further includes:

The wireless transmission module 11 for remotely transmitting the random sampling parameters to the production line control module 20, As an alternative embodiment, the manufacturing execution module 10 further includes the wireless transmission module 11 for remotely transmitting the random sampling parameters to the production line control module 20, since the array process of the substrate needs to be carried out in the ultra-clean plant, there is a high demand for cleanliness of the environment, and therefore, the operation of the operators is greatly restricted. In the present embodiment, the operator can set the random sampling parameters in the manufacturing execution module 10 and transmit it to the production line control module 20 by wireless transmission, and do not have to enter the production line in the ultra-clean plant, greatly improving the work efficiency.

Alternatively, the production line control module 20 further includes:

A control module 22 for transmitting the random sampling control signal to the detector 30.

As an alternative embodiment, the production line control module 20 further includes the control module 22 for transmitting the random sampling control signal to the detector 30. In the present embodiment adopting the programmable logic controller, PLC controller that is widely used in industry, to realize the control of the production line control module 20 to the detector 30, and is cost-effective and reliable.

The present application also provides an in-line inspection apparatus of the display panel including a processor and a nonvolatile memory. The nonvolatile memory stores executable instructions, the processor executes the executable instructions for realizing the methods described in the above-described embodiments. Those skilled in the art will readily appreciate that the modules/units 10, 20, 23, 21 shown in the accompanying drawings of the present application may be software modules or software units. In addition, each of the software modules or software units may be inherently stored in non-volatile memory and executed by the processor.

It will be apparent to those skilled in the art that the method of the embodiments described above may be implemented by means of software plus the necessary general-purpose hardware platform, and of course may also be hardware, but in many cases the former is a preferred embodiment. Based on this understanding, the technical solution of the present application may be embodied in the form of a software product that is stored in a storage medium (such as ROM/RAM, disk, CD-ROM) includes a number of instructions for enabling a terminal (which may be a mobile phone, a computer, a server, an air conditioner, or a network device, etc.) to perform the method described in the various embodiments of the present application.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A method for inspecting a display panel, comprising:
setting substrate random sampling parameters respectively for steps of a production chain in a manufacturing process of the display panel by a manufacturing execution module, and transmitting the random sampling parameters to a production line control module;
receiving and storing the random sampling parameters by the production line control module;
generating a random sampling control signal and transmitting to a detector by the production line control module, wherein the random sampling control signal is one of corresponding random sampling control signals generated in the respective steps according to the random sampling parameters; and
performing a random sampling to a substrate by the detector in accordance with the random sampling control signal.

2. The method for inspecting the display panel according to claim 1, wherein after the step of receiving and storing the random sampling parameters by the production line control module, further comprising the step of:
acquiring a product information of the substrate inspected by the detector by the production line control module, wherein the product information comprises what kind of process step the substrate has passed and what kind of process step is needed subsequently.

3. The method for inspecting the display panel according to claim 2, wherein the step of generating the random sampling control signal and transmitting to the detector by the production line control module, specifically comprises:
comparing the product information with the stored random sampling parameters by the production line control module, and generates the random sampling control signal corresponding to the substrate.

4. The method for inspecting the display panel according to claim 1, wherein the manufacturing execution module remotely transmits the random sampling parameters to the production line control module by a wireless transmission way.

5. The method for inspecting the display panel according to claim 1, wherein the production line control module transmits the random sampling control signal to the detector through a control module.

6. The method for inspecting the display panel according to claim 5, wherein the control module is a programmable logic controller.

7. The method for inspecting the display panel according to claim 1, wherein the display panel is a liquid crystal display panel, an organic light emitting diode display panel, a quantum dot light emitting diodes display panel or a curved surface display panel.

* * * * *